(12) United States Patent
Nguyen et al.

(10) Patent No.: US 7,202,564 B2
(45) Date of Patent: Apr. 10, 2007

(54) ADVANCED LOW DIELECTRIC CONSTANT ORGANOSILICON PLASMA CHEMICAL VAPOR DEPOSITION FILMS

(75) Inventors: Son Nguyen, Yorktown Heights, NY (US); Sarah L. Lane, Wappingers Falls, NY (US); Jia Lee, Fremont, CA (US); Kensaku Ida, Wappingers Falls, NY (US); Darryl D. Restaino, Modena, NY (US); Takeshi Nogami, Hartsdale, NY (US)

(73) Assignee: International Business Machines Corporation, Armonk, NY (US)

( * ) Notice: Subject to any disclaimer, the term of this patent is extended or adjusted under 35 U.S.C. 154(b) by 106 days.

(21) Appl. No.: 10/906,370

(22) Filed: Feb. 16, 2005

(65) Prior Publication Data

US 2006/0183345 A1    Aug. 17, 2006

(51) Int. Cl.
*H01L 23/48* (2006.01)

(52) U.S. Cl. .................. 257/758; 257/759; 257/760

(58) Field of Classification Search ............... 257/311, 257/374, E29.015, E21.581, 758, 759, 760
See application file for complete search history.

(56) References Cited

U.S. PATENT DOCUMENTS

| | | | |
|---|---|---|---|
| 6,147,009 A | 11/2000 | Grill et al. | |
| 6,312,793 B1 | 11/2001 | Grill et al. | |
| 6,441,491 B1 | 8/2002 | Grill et al. | |
| 6,479,110 B2 | 11/2002 | Grill et al. | |
| 6,497,963 B1 | 12/2002 | Grill et al. | |
| 6,541,398 B2 | 4/2003 | Grill et al. | |
| 6,653,247 B2* | 11/2003 | MacNeil | 438/798 |
| 6,756,323 B2 | 6/2004 | Grill et al. | |
| 6,768,200 B2* | 7/2004 | Grill et al. | 257/758 |
| 6,770,570 B2 | 8/2004 | Li et al. | |
| 6,770,573 B2 | 8/2004 | Grill et al. | |
| 6,790,789 B2 | 9/2004 | Grill et al. | |

(Continued)

OTHER PUBLICATIONS

U.S. Appl. No. 10/964,254, "Ultra Low k Plasma Enhanced Chemical Vapor Deposition Processes Using A Single Bifunctional Precursor Containing Both A SiCOH Matrix Functionality And Organic Porogen Functionality", Son Nguyen, et al., filed Oct. 13, 2004.
U.S. Appl. No. 10/390,801, Ultra Low K (ULK) SiCOH Film And Method, Stephen M. Gates, et al., filed Mar. 18, 2003.

(Continued)

*Primary Examiner*—Thao P. Le
(74) *Attorney, Agent, or Firm*—Scully, Scott, Murphy & Presser, P.C.; Todd M. C. Li, Esq.

(57) ABSTRACT

A porous low k or ultra low k dielectric film comprising atoms of Si, C, O and H (hereinafter "SiCOH") in a covalently bonded tri-dimensional network structure having a dielectric constant of less than about 3.0, a higher degree of crystalline bonding interactions, more carbon as methyl termination groups and fewer methylene, $-CH_2-$ crosslinking groups than prior art SiCOH dielectrics is provided. The SiCOH dielectric is characterized as having a FTIR spectrum comprising a peak area for $CH_3+CH_2$ stretching of less than about 1.40, a peak area for SiH stretching of less than about 0.20, a peak area for $SiCH_3$ bonding of greater than about 2.0, and a peak area for Si—O—Si bonding of greater than about 60%, and a porosity of greater than about 20%.

29 Claims, 5 Drawing Sheets

U.S. PATENT DOCUMENTS

| | | | |
|---|---|---|---|
| 7,030,468 B2* | 4/2006 | Gates et al. | 257/632 |
| 2003/0017635 A1* | 1/2003 | Apen et al. | 438/29 |
| 2003/0087043 A1 | 5/2003 | Edelstein et al. | |
| 2005/0064698 A1* | 3/2005 | Chang et al. | 438/623 |
| 2005/0140029 A1* | 6/2005 | Li et al. | 257/790 |
| 2006/0084256 A1* | 4/2006 | Cabral et al. | 438/597 |

OTHER PUBLICATIONS

U.S. Appl. No. 10/758,724, "Low K And Ultra Low K SiCOH Dielectric Films And Methods To Form The Same", Stephen M. Gates, et al., filed Jan. 16, 2004.

U.S. Appl. No. 10/709,320, LowK Interlevel Dielectric Layer (ILD) And Method, Jia Lee, et al., filed Apr. 28, 2004.

* cited by examiner

ADVANCED LOW DIELECTRIC CONSTANT ORGANOSILICON PLASMA CHEMICAL VAPOR DEPOSITION FILMS

FIELD OF THE INVENTION

The present invention relates to dielectric materials comprising atoms of Si, C, O and H (hereinafter "SiCOH" dielectric materials), which are porous and have a dielectric constant (k) on the order of less than about 3.0, and methods for fabricating films of these materials and electronic devices containing such films. The SiCOH dielectric material of the present invention has higher porosity, as compared with prior art SiCOH dielectric materials, and a higher degree of crystalline bonding interaction that leads to improved mechanical properties. The present invention also relates to a non-equilibrium method to fabricate the inventive material as well as to the use of said dielectric material as an intralevel or interlevel dielectric film, a dielectric cap or a hard mask/polish stop in back end of the line (BEOL) interconnect structures on ultra-large scale integrated (ULSI) circuits and related electronic structures.

BACKGROUND OF THE INVENTION

The continuous shrinking in dimensions of electronic devices utilized in ULSI circuits in recent years has resulted in increasing the resistance of the BEOL metallization as well as increasing the capacitance of the intralayer and interlayer dielectric. This combined effect increases signal delays in ULSI electronic devices. In order to improve the switching performance of future ULSI circuits, low dielectric constant (k) insulators and particularly those with k significantly lower than silicon oxide are needed to reduce the capacitances.

Most of the fabrication steps of very large scale integration (VLSI) and ULSI chips are carried out by plasma enhanced chemical or physical vapor deposition techniques. The ability to fabricate a low k material by a plasma enhanced chemical vapor deposition (PECVD) technique using previously installed and available processing equipment will thus simplify its integration in the manufacturing process, reduce manufacturing cost, and create less hazardous waste. U.S. Pat. Nos. 6,147,009 and 6,497,963, which are incorporated herein by reference in their entirety, describe a low dielectric constant material consisting of elements of Si, C, O and H atoms having a dielectric constant not more than 3.6 and which exhibits very low crack propagation velocities.

U.S. Pat. Nos. 6,312,793, 6,441,491 and 6,479,110 B2, incorporated herein by reference in their entirety, describe a multiphase low k dielectric material that consists of a matrix composed of elements of Si, C, O and H atoms, a phase composed mainly of C and H and having a dielectric constant of not more than 3.2.

Ultra low k dielectric materials having a dielectric constant of less than 2.7 (and preferably less than 2.3) are also known in the art. The low k and ultra low k SiCOH films can be non-porous, or porous. Porous films are typically formed by introducing a porogen during the deposition of the film, which is subsequently removed after deposition using a conventional curing process. Generally, porous SiCOH films have a lower dielectric constant than the corresponding non-porous SiCOH films.

A key problem with prior art low and ultra low k SiCOH films is that they have poor mechanical properties (such as, for example, a high crack velocity and stress, and a low modulus and hardness). Typically, the mechanical properties of prior art SiCOH dielectrics deteriorate as the dielectric constant of the material decreases. Hence, porous SiCOH dielectrics tend to have poorer mechanical properties than the corresponding non-porous SiCOH dielectrics.

Improved mechanical properties of low k or ultra low k SiCOH dielectrics can be achieved in the prior art by treating the SiCOH films post deposition. For example, curing or treatment using thermal, UV light, electron beam irradiation, chemical energy or a combination of these energy sources has been used to stabilize the low or ultra low k dielectric material and to improve the mechanical properties of the same. While such post deposition treatments are possible, they add extra processing steps and thus cost to the manufacturing of low k or ultra low k dielectric films.

In view of the above, there is a need for providing porous low k and ultra low k dielectric films which exhibit good electronic and mechanical properties, without the need for post film treatments or introducing a porogen during the deposition process.

SUMMARY OF THE INVENTION

The present invention provides a porous low k or ultra low k dielectric film comprising atoms of Si, C, O and H (hereinafter "SiCOH") in a covalently bonded tri-dimensional network structure having a dielectric constant of less than about 3.0, a higher degree of crystalline bonding interactions, more carbon as methyl termination groups and fewer methylene, —$CH_2$— crosslinking groups than prior art SiCOH dielectrics. The term "tri-dimensional network" is used throughout the present invention to denote a SiCOH dielectric material which includes atoms of Si, C, O and H that are interconnected and interrelated in the x, y and z directions. The phrase "higher degree of crystalline interaction" is used herein to denote a SiCOH film with more local bonding between the Si, C, O and H. This can be seen in the FTIR and NMR bonding spectra where the corresponding bonding peak become sharper with narrower bonding peak width as compare to a standard film with a lower degree of bonding crystallinity.

The higher degree of crystalline bonding interaction is believed to provide the inventive SiCOH dielectric material with improved mechanical strength as compared to prior art SiCOH dielectrics. Decreased amounts of methylene crosslinking groups present in the inventive film provides the film with a higher degree of porosity and increased polarization groups as compared to their prior art SiCOH counterparts.

In broad terms, the present invention provides a dielectric material comprising atoms of Si, C, O and H having a tri-dimensional network structure in which the material has a FTIR spectrum comprising a peak area for $CH_3+CH_2$ stretching of less than about 1.40, a peak area for SiH stretching of less than about 0.20, a peak area for $SiCH_3$ bonding of greater than about 2.0, and a peak area for Si—O—Si bonding of greater than about 60, and a porosity, in terms of fraction meso-pore volume distribution, of greater than about 20%. Each peak area mentioned is normalized to a given thickness of a dielectric material.

The values mentioned above are for as deposited SiCOH dielectrics; without any post treatment steps being preformed. Post treatment such as UV treatment has been found to reduce the Si—H and Si—$CH_2$—Si crosslinking bonding and increase the Si—O—Si bonding. The post treatment process can further improve the inventive SiCOH dielectric film's mechanical and electrical properties.

The present invention also relates to electronic structures, in which the SiCOH dielectric material of the present invention may be used as an interlevel or intralevel dielectric, a capping layer, and/or as a hard mask/polish-stop layer in electronic structures.

Specifically, the electronic structures of the present invention includes a pre-processed semiconducting substrate that has a first region of metal embedded in a first layer of insulating material, a first region of conductor embedded in a second layer of insulating material, the second layer of insulating material being in intimate contact with the first layer of insulating material, the first region of conductor being in electrical communication with the first region of metal, and a second region of conductor being in electrical communication with the first region of conductor and being embedded in a third layer of insulating material, the third layer of insulating material being in intimate contact with the second layer of insulating material.

In the above structure, each of the insulating layers can comprise the inventive low or ultra low k SiCOH dielectric material.

The electronic structure may further include a dielectric cap layer situated in-between the first layer of insulating material and the second layer of insulating material, and may further include a dielectric cap layer situated in-between the second layer of insulating material and the third layer of insulating material. The electronic structure may further include a first dielectric cap layer between the second layer of insulating material and the third layer of insulating material, and a second dielectric cap layer on top of the third layer of insulating material.

In some embodiments, the dielectric cap itself can comprise the inventive low or ultra low k SiCOH dielectric material.

The electronic structure may further include a diffusion barrier layer of a dielectric material deposited on at least one of the second and third layer of insulating material. The electronic structure may further include a dielectric layer on top of the second layer of insulating material for use as a RIE hard mask/polish-stop layer and a dielectric diffusion barrier layer on top of the dielectric RIE hard mask/polish-stop layer. The electronic structure may further include a first dielectric RIE hard mask/polish-stop layer on top of the second layer of insulating material, a first dielectric RIE diffusion barrier layer on top of the first dielectric polish-stop layer a second dielectric RIE hard mask/polish-stop layer on top of the third layer of insulating material, and a second dielectric diffusion barrier layer on top of the second dielectric polish-stop layer. The dielectric RIE hard mask/polish-stop layer may be comprised of the inventive SiCOH dielectric material as well.

The present invention also relates to a method of fabricating the inventive SiCOH material. Specifically and in broad terms, the method of the present invention comprises placing a substrate in a reactor;

introducing a first precursor comprising atoms of Si, C, O and H, an oxidizing agent and an inert carrier into said reactor; and depositing a SiCOH dielectric film comprising atoms of Si, C, O and H and having a tri-dimensional network structure in which the material has a FTIR spectrum comprising a peak area for $CH_3+CH_2$ stretching of less than about 1.40, a peak area for SiH stretching of less than about 0.20, a peak area for $SiCH_3$ bonding of greater than about 2.0, and a peak area for Si—O—Si bonding of greater than about 60, and a porosity of greater than about 20% onto said substrate.

During the depositing step, a low high frequency (HF)/low frequency (LF) power (on the order of about 150 Watts or less) is used to reduce the ion bombardment. By using a low HF/LF power more dimeric, trimeric and tetrameric species of the first precursor are present in the plasma. Additionally, the inventive depositing step is performed using a greater oxidizing agent/first precursor ratio. Typically, this ratio is about 1:2 or greater. The higher oxidizing agent/first precursor ratio provides for a greater quantity of large reactive species, but with reduced crosslinking bonding. Specifically, the depositing step of the present invention is performed in a non-equilibrium plasma CVD region where higher multi-meric molecular weight reactive species (e.g., dimer, trimer, tetramer fragments of the original organosilicon precursor) are formed in the discharge and deposited as a part of the porous film.

DETAILED DESCRIPTION OF THE INVENTION

The present invention, which provides a low or ultra low k SiCOH dielectric film, having good electronic and mechanical properties, will now be described in greater detail. The drawings, which are used to illustrate the process of forming the inventive SiCOH film as well as some electronic structures that can include the same, are not drawn to scale.

Figure 1:
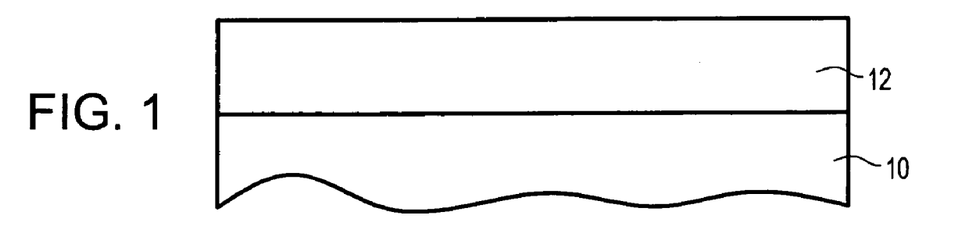
FIG. 1 is a pictorial representation (through a cross sectional view) showing the formation of the inventive SiCOH dielectric material on a substrate.

Reference is made first to FIG. 1 which illustrates a structure that is provided after forming the inventive SiCOH dielectric film 12 on a surface of a substrate 10. The term "substrate" when used in conjunction with substrate 10 includes, a semiconducting material, an insulating material, a conductive material or any combination thereof, including multilayered structures. Thus, for example, substrate 10 can be a semiconducting material such as Si, SiGe, SiGeC, SiC, GaAs, InAs, InP and other III/V or II/VI compound semiconductors. The semiconductor substrate 10 can also include a layered substrate such as, for example, Si/SiGe, Si/SiC, silicon-on-insulators (SOIs) or silicon germanium-on-insulators (SGOIs).

When substrate 10 is an insulating material, the insulating material can be an organic insulator, an inorganic insulator or a combination thereof including multilayers. When the substrate 10 is a conductive material, the substrate 10 may include, for example, polySi, an elemental metal, alloys of elemental metals, a metal silicide, a metal nitride and combinations thereof, including multilayers.

In some embodiments, the substrate 10 includes a combination of a semiconducting material and an insulating material, a combination of a semiconducting material and a conductive material or a combination of a semiconducting material, an insulating material and a conductive material.

When the substrate 10 comprises a semiconductor material, one or more semiconductor devices such as complementary metal oxide semiconductor (CMOS) devices can be fabricated thereon. For clarity, the one or more semiconductor devices are not shown in the drawings of the present application.

The inventive dielectric film 12 comprises a porous dielectric material that comprises atoms of Si, C, O and H (SiCOH) also called C doped oxide (CDO) or organosilicate glass (OSG). The thickness of the SiCOH dielectric film 12 deposited may vary; typical ranges for the deposited SiCOH dielectric film 12 are from about 50 nm to about 1 nm, with a thickness from 100 to about 500 nm being more typical. The dielectric constant of the inventive dielectric film is less than about 3.0, with a dielectric constant from about 2.2 to about 2.8 being more typical. Dielectrics having a dielectric constant of less than about 2.7 are considered herein as ultra low k dielectrics.

The SiCOH dielectric 12 of the present invention has a tri-dimensional network structure in which Si, C, O and H are interconnected and interrelated in the x, y and z directions. The inventive SiCOH dielectric is characterized as having a FTIR spectrum comprising a peak area for $CH_3$+$CH_2$ stretching of less than about 1.40, a peak area for SiH stretching of less than about 0.20, a peak area for $SiCH_3$ bonding of greater than about 2.0, and a peak area for Si—O—Si bonding of greater than about 60, and a porosity, in terms of fraction meso-pore volume distribution, of greater than about 20%. Each peak area mentioned is normalized to a given thickness of a dielectric material.

Typically, the inventive SiCOH dielectric 12 has a FTIR spectrum having a peak area for $CH_3$+$CH_2$ stretching at about 2830 to about 3050 $cm^{-1}$, a peak area for SiH stretching at about 2170 to about 2240 $cm^{-1}$, a peak area for $SiCH_3$ bonding at about 1250 to about 1290 $cm^{-1}$ and at about 750 to about 860 $cm^{-1}$, and a peak area for Si—O—Si bonding at about 960 to about 1220 $cm^{-1}$. In some embodiments, the inventive SiCOH dielectric 12 is characterized as having a FTIR spectrum having a peak area for $CH_3$+$CH_2$ stretching of about 1.35, a peak area for SiH stretching of about 0.13, and a peak area for $SiCH_3$ bonding of about 2.18 and a peak area for Si—O—Si bonding of about 62.9.

The SiCOH dielectric film 12 typically comprises between about 5 and about 40 atomic percent of Si; between about 5 and about 45 atomic percent of C; between 0 and about 50 atomic percent of O; and between about 10 and about 55 atomic percent of H.

The SiCOH dielectric film 12 of the present invention is made using a process in which a low HF/LF power ratio is used to reduce ion bombardment on the as deposited film. This causes more dimeric, trimeric and/or tetrameric reactive species of the first precursor in the plasma. This provides the SiCOH dielectric films of the present invention with a high degree of crystallinity and improved mechanical properties. Moreover, the ratio of oxidizing agent to first precursor is selected to provide larger reactive species that help to reduce crosslinking within the film.

The SiCOH dielectric film 12 of the present invention has a higher porosity than prior art SiCOH dielectric films. Specifically, the SiCOH dielectric film 12 of the present invention has a measured porosity that is on the order of about 20% or greater, with a measured porosity from about 22 to about 25% being more typical. The porosity of the inventive film 12 is higher than that of prior art SiCOH dielectric in which the porosity is typically on the order of about 15% or less.

The mechanical properties of the as deposited SiCOH film 12 include a modulus value ranging from about 6 to about 12 GPa, a hardness ranging from about 0.8 to about 1.6 GPa, a stress ranging from about 35 to about 70 MPa, a cohesive strength from about 2.5 to about 6 $J/m^2$, a crack velocity at 1.2 μm of from about 1E-12 to about 4E-10 m/sec, and a density, as measured by RBS, from about 4E22 to about 9E22 atom/$cm^3$. More typically, the mechanical properties of the as deposited SiCOH film 12 include a modulus value ranging from about 7 to about 10 GPa, a hardness ranging from about 0.9 to about 1.2 GPa, a stress ranging from about 40 to about 60 MPa, a cohesive strength from about 3.5 to about 4.5 $J/m^2$, a crack velocity at 1.2 □m of from about 5E-11 to about 1.5E-10 m/sec, and a density, as measured by RBS, from about 5E22 to about 7E22 atoms/$cm^3$.

The electronic properties of the inventive SiCOH film 12 include a breakdown voltage of greater than about 7 MV/cm, and a leakage density of about 1E-9 Amp/$cm^2$ at 2 MV/cm applied voltage or greater. More typically, the inventive SiCOH film 12 has a breakdown voltage of about than about 8 MV/cm and a leakage density of about 1E-9 Amp/$cm^2$ at 2 MV/cm applied voltage or greater.

The SiCOH dielectric film 12 is deposited by placing the substrate 10 into a reactor chamber such as a plasma enhanced chemical vapor deposition (PECVD). Specifically, the SiCOH dielectric film 12 is formed by providing and introducing at least a first precursor (liquid, gas or vapor) comprising atoms of Si, C, O, and H, an oxidizing agent and an inert carrier such as He or Ar, into a reactor, preferably the reactor is a PECVD reactor, and then depositing a film derived from said first precursor onto a suitable substrate utilizing conditions that are effective in forming the inventive SiCOH dielectric material.

The first precursor is selected from organic molecules with ring structures comprising SiCOH components such as 1,3,5,7-tetramethylcyclotetrasiloxane ("TMCTS" or "$C_4H_{16}O_4Si_4$"), octamethylcyclotetrasiloxane (OMCTS), diethoxymethylsilane (DEMS), dimethyldimethoxysilane (DMDMOS), diethylmethoxysilane (DEDMOS), and related cyclic and non-cyclic silanes, siloxanes and the like.

Examples of oxidizing agents that can be used in the present invention include $O_2$, $CO_2$, $N_2O$ or a combination thereof. The oxidizing agent is used to stabilize the reactant in the reactor and it helps to improve the uniformity of the SiCOH dielectric film 12 deposited on the substrate 10. The inert carrier comprises Ar, He, Ne, Xe or mixtures thereof, with He being most typical.

In a preferred embodiment of the present invention, the SiCOH dielectric film 12 may be deposited using a method the includes the step of providing a parallel plate reactor, which has a conductive area of a substrate chuck between about 85 cm$^2$ and about 750 cm$^2$, and a gap, i.e., spacing, between the substrate and a top electrode between about 1 cm and about 12 cm. The reactor may also include another electrode. A high frequency RF power is applied to one of the electrodes and an additional low frequency power is typically applied to another electrode within the reactor.

The conditions used for the deposition step may vary depending on the desired final dielectric constant of the SiCOH dielectric film. Broadly, the conditions used for providing a stable dielectric material comprising elements of Si, C, O and H that has a dielectric constant of about 3.0 or less include: setting the substrate temperature at between about 250° C. and about 450° C.; setting the high frequency RF power density at between about 0.20 W/cm$^2$ and about 0.85 W/cm$^2$; setting the first precursor flow rate at between about 1800 mg/min and about 3600 mg/min, setting the oxidizing agent flow rate at between about 120 to about 320 sccm, setting the inert carrier gases such as helium (and/or argon) flow rate at between about 500 sccm to about 2000 sccm; setting the reactor pressure at a pressure between about 4 Torr and about 8 Torr; setting the high frequency RF power between about 150 W and about 800 W; and setting the low frequency power between about 0 W and about 200 W.

More preferably, the conditions used for providing a stable dielectric material comprising elements of Si, C, O and H that has a dielectric constant of about 3.0 or less include: setting the substrate temperature at between about 300° C. and about 400° C.; setting the high frequency RF power density at between about 0.4 W/cm$^2$ and about 0.6 W/cm$^2$; setting the first precursor flow rate at between about 2500 mg/min and about 3000 mg/min, setting the oxidizing agent flow rate at between about 200 to about 250 sccm, setting the inert carrier gases such as helium (and/or argon) flow rate at between about 800 sccm to about 1200 sccm; setting the reactor pressure at a pressure between about 5 Torr and about 6 Torr; setting the high frequency RF power between about 300 W and about 500 W; and setting the low frequency power between about 40 W and about 80 W. When the conductive area of the substrate chuck is changed by a factor of X, the RF power applied to the substrate chuck is also changed by a factor of X.

After deposition, the SiCOH dielectric material 12 may optionally be treated utilizing an energy source such as thermal, electron beam, plasma, microwave or optical radiation such as UV or laser. Combinations of the aforementioned energy sources can also be used in the present invention.

The thermal energy source includes any source such as, for example, a heating element or a lamp, that can heat the deposited SiCOH dielectric 12 to a temperature up to 450° C. More preferably, the thermal energy source is capable of heating the SiCOH dielectric 12 to a temperature from about 2000 to about 450° C., with a temperature from about 350° C. to about 425° C. being even more preferred. This thermal treatment process can be carried out for various time periods, with a time period from about 0.5 minutes to about 300 minutes being typical. The thermal treatment step is typically performed in the presence of an inert gas such as He, Ar, Ne, Xe, N$_2$ or a mixture thereof. The thermal treatment step may be referred to as an anneal step in which rapid thermal anneal, furnace anneal, laser anneal or spike anneal conditions are employed.

In some embodiments, the thermal treatment step can be performed in the presence of a gas mixture containing a hydrogen source gas such as, for example, H$_2$ or a hydrocarbon. In yet other embodiments, the thermal treatment step can be performed in the presence of a gas mixture containing a very low partial pressure of O$_2$ and H$_2$O, in the range below 1000 parts per million.

The UV light treatment step is performed utilizing a source that can generate light having a wavelength from about 500 to about 150 nm, to irradiate the substrate while the wafer temperature is maintained at up to 450° C., with temperatures from 200° C.–450° C. being preferred and a temperature from 350° C. to 425° C. being even more highly preferred. Radiation with >370 nm is of insufficient energy to dissociate or activate important bonds, so the wavelength range 150–370 nm is a preferred range. Using literature data and absorbance spectra measured on as deposited films, it has been have found that <170 nm radiation may not be favored due to degradation of the SiCOH film. Further, the energy range 310–370 nm is less useful than the range 150–310 nm, due to the relatively low energy per photon from 310–370 nm. Within the 150–310 nm range, optimum overlap with the absorbance spectrum of the as deposited film and minimum degradation of the film properties (such as hydrophobicity) may be optionally used to select a most effective region of the UV spectrum for changing the SiCOH properties.

The UV light treatment step may be performed in an inert gas, a hydrogen source gas or a gas mixture of O$_2$ and H$_2$O using the partial pressure range mentioned above.

The electron beam treatment step is performed utilizing a source that is capable of generating a uniform electron flux over the wafer, with energies from 0.5 to 25 keV and current densities from 0.1 to 100 microAmp/cm$^2$ (preferably 1 to 5 microAmp/cm$^2$), while the wafer temperature is maintained at a temperature up to 450° C., with temperatures from 200°–450° C. being preferred, and temperature from 350° to 425° being even more highly preferred. The preferred dose of electrons used in the electron beam treatment step is from 50 to 500 microcoulombs/cm$^2$, with 100 to 300 microcoulombs/cm$^2$ range being preferred.

The electron beam treatment step may be performed in an inert gas, a hydrogen source gas or a gas mixture of O$_2$ and H$_2$O using the partial pressure range mentioned above.

The plasma treatment step is performed utilizing a source that is capable of generating atomic hydrogen (H), and optionally CH$_3$ or other hydrocarbon radicals. Downstream plasma sources are preferred over direct plasma exposure. During plasma treatment the wafer temperature is maintained at a temperature up to 450° C., with temperatures from 200° C.–450° C. being preferred and temperatures from 350° C. to 425° C. being more highly preferred.

The plasma treatment step is performed by introducing a gas into a reactor that can generate a plasma and thereafter it is converted into a plasma. The gas that can be used for the plasma treatment includes inert gases such as Ar, N, He, Xe or Kr, with He being preferred; hydrogen or related sources of atomic hydrogen, methane, methylsilane, related sources of CH$_3$ groups, and mixtures thereof. The flow rate of the plasma treatment gas may vary depending on the reactor system being used. The chamber pressure can range anywhere from 0.05 to 20 Torr, but the preferred range of pressure operation is 1 to 10 Torr. The plasma treatment step occurs for a period of time, which is typically from about ½ to about 10 minutes, although longer times may be used within the invention.

An RF or microwave power source is typically used to generate the above plasma. The RF power source may operate at either a high frequency range (on the order of about 100 W or greater); a low frequency range (less than 250 W) or a combination thereof may be employed. The high frequency power density can range anywhere from 0.1 to 2.0 W/cm$^2$ but the preferred range of operation is 0.2 to 1.0 W/cm$^2$. The low frequency power density can range anywhere from 0.1 to 1.0 W/cm$^2$ but the preferred range of operation is 0.2 to 0.5 W/cm$^2$. The chosen power levels must be low enough to avoid significant sputter etching of the exposed dielectric surface (<5 nanometers removal).

In addition to the above, a deep ultra-violet (DUV) laser source can also be employed. The laser source used to treat the deposited SiCOH dielectric 12 is typically an excimer laser which operates at one of several DUV wavelengths depending on the laser gas mixture. For example, a XeF laser which produces 308 nm radiation can be employed. Also, a KrF laser that produces 248 nm radiation, or a ArF laser that produces 193 nm radiation can be employed in the present invention. Excimer lasers can operate at several hundred pulses per second with pulse energies up to a joule (J) resulting in several hundred Watt (W) output.

The laser employed in treating the as deposited SiCOH dielectric 12 preferably operates under a pulse mode. The laser beam can be expanded to expose the entire sample. Alternatively, and for larger samples, the laser exposure area can be raster scanned across the sample to provide uniform dose. Using excimer lasers, the fluence is limited to less than 5 mJ/cm$^2$ per pulse to ensure ablation will not occur. The short pulse duration of about 10 ns for the excimer laser can cause material ablation at fluence levels greater than 20 mJ/cm$^2$. Typically, laser fluence levels of 0.1–5 mJ/cm$^2$ per pulse are employed. The total dose can vary from 1 to 10000 Joules/cm$^2$, preferably 500–2000 J/cm$^2$. This is achieved by multiple laser pulse exposure. For example, a dose of 1000 J/cm$^2$ can be obtained using a fluence of 1 mJ/cm$^2$ for duration of 106 pulses. Excimer laser normally operates at a few hundreds pulses per second. Depending of the total dosage required, the overall exposure time period for the DUV laser treatment for a several seconds to hours. A typical 500 J/cm$^2$ dose is achieved in less than 15 min using a 200 Hz laser operating at a fluence level of 3 mJ/cm$^2$ per pulse.

The above described treatment steps are optional and need not be performed to achieve a SiCOH dielectric film that has good electronic and mechanical properties. The above treatments however can be used with the inventive SiCOH dielectric film without significantly impacting the electrical and mechanical properties of the dielectric film.

The above treatment provides a SiCOH dielectric that is characterized as having a FTIR spectrum having a peak area for CH$_3$+CH$_2$ stretching at about 2830 to about 3050 cm$^{-1}$, a peak area for SiH stretching at about 2170 to about 2240 cm$^{-1}$, a peak area for SiCH$_3$ bonding at about 1250 to about 1290 cm$^{-1}$ and at about 750 to about 860 cm$^{-1}$, and a peak area for Si—O—Si bonding at about 960 to about 1220 cm$^{-1}$. Additionally, the inventive post treated SiCOH dielectric has a FTIR spectrum having a peak area for CH$_3$+CH$_2$ stretching of about 1.06, a peak area for SiH stretching of about 0, and a peak area for SiCH$_3$ bonding of about 2.23 and a peak area for Si—O—Si bonding of about 66.3. The post treated SiCOH film of the present invention typically has a modulus of about 9 to about 11 GPa.

The electronic devices which can include the inventive SiCOH dielectric are shown in FIGS. 2–5. It should be noted that the devices shown in FIGS. 2–5 are merely illustrative examples of the present invention, while an infinite number of other devices may also be formed by the present invention.

Figure 2:
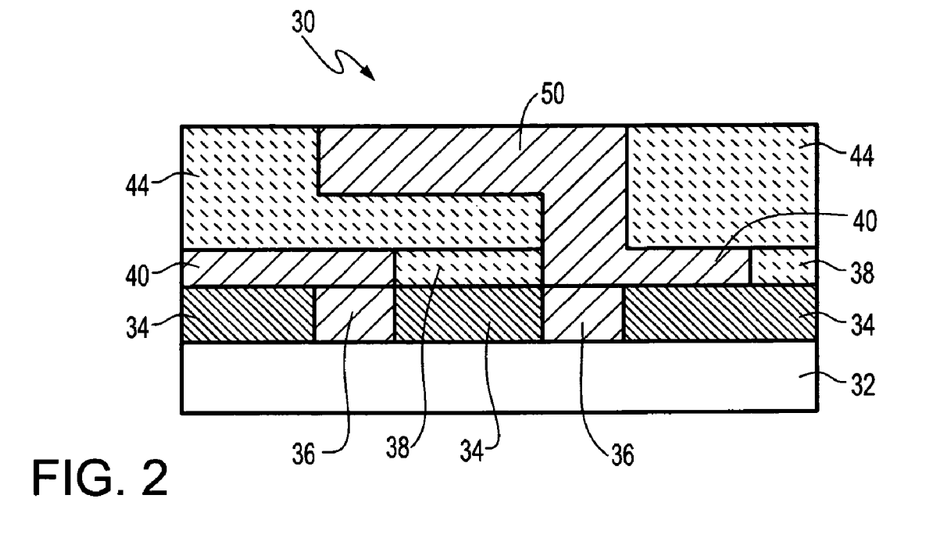
FIG. 2 is an enlarged, cross-sectional view of an electronic device of the present invention that includes the inventive SiCOH dielectric film as both the intralevel dielectric layer and the interlevel dielectric layer.

In FIG. 2, an electronic device 30 built on a silicon substrate 32 is shown. On top of the silicon substrate 32, an insulating material layer 34 is first formed with a first region of metal 36 embedded therein. After a CMP process is conducted on the first region of metal 36, a SiCOH dielectric film 38 of the present invention is deposited on top of the first layer of insulating material 34 and the first region of metal 36. The first layer of insulating material 34 may be suitably formed of silicon oxide, silicon nitride, doped varieties of these materials, or any other suitable insulating materials. The SiCOH dielectric film 38 is then patterned in a photolithography process followed by etching and a conductor layer 40 is deposited thereon. After a CMP process on the first conductor layer 40 is carried out, a second layer of the inventive SiCOH film 44 is deposited by a plasma enhanced chemical vapor deposition process overlying the first SiCOH dielectric film 38 and the first conductor layer 40. The conductor layer 40 may be deposited of a metallic material or a nonmetallic conductive material. For instance, a metallic material of aluminum or copper, or a nonmetallic material of nitride or polysilicon. The first conductor 40 is in electrical communication with the first region of metal 36.

A second region of conductor 50 is then formed after a photolithographic process on the inventive SiCOH dielectric film 44 is conducted followed by etching and then a deposition process for the second conductor material. The second region of conductor 50 may also be deposited of either a metallic material or a nonmetallic material, similar to that used in depositing the first conductor layer 40. The second region of conductor 50 is in electrical communication with the first region of conductor 40 and is embedded in the second layer of the inventive SiCOH dielectric film 44. The second layer of the inventive SiCOH dielectric film is in intimate contact with the first layer of the inventive SiCOH dielectric material 38. In this example, the first layer of the inventive SiCOH dielectric film 38 is an intralevel dielectric material, while the second layer of the inventive SiCOH dielectric film 44 is both an intralevel and an interlevel dielectric.

Figure 3:
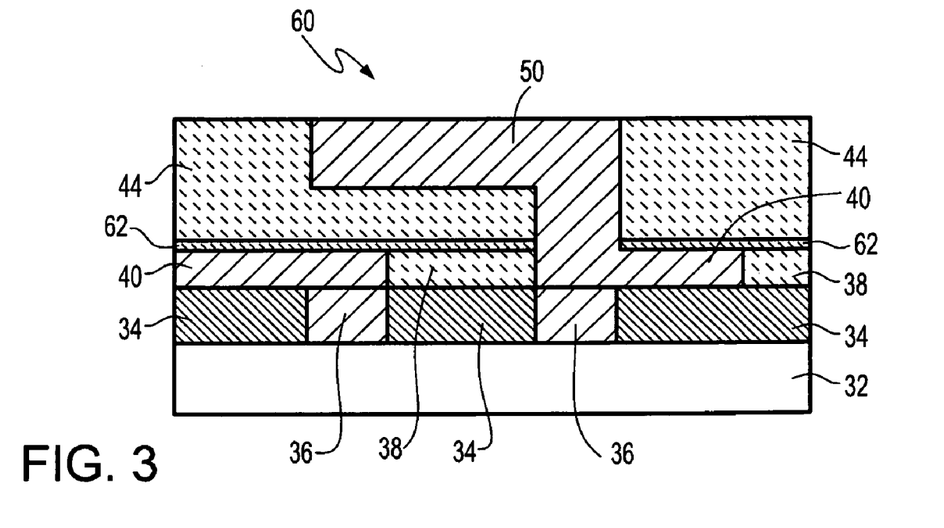
FIG. 3 is an enlarged, cross-sectional view of the electronic structure of FIG. 2 having an additional diffusion barrier dielectric cap layer deposited on top of the inventive SiCOH dielectric film.

FIG. 3 shows a present invention electronic device 60 similar to that of electronic device 30 shown in FIG. 2, but with an additional dielectric cap layer 62 deposited between the first insulating material layer 38 and the second insulating material layer 44. The dielectric cap layer 62 can be suitably formed of a material such as silicon oxide, silicon nitride, silicon oxynitride, refractory metal silicon nitride with the refractory metal being Ta, Zr, Hf or W, silicon carbide, silicon carbo-nitride (SiCN), silicon carbo-oxide (SiCO), and their hydrogenated compounds. The additional dielectric cap layer 62 functions as a diffusion barrier layer for preventing diffusion of the first conductor layer 40 into the second insulating material layer 44 or into the lower layers, especially into layers 34 and 32.

Figure 4:
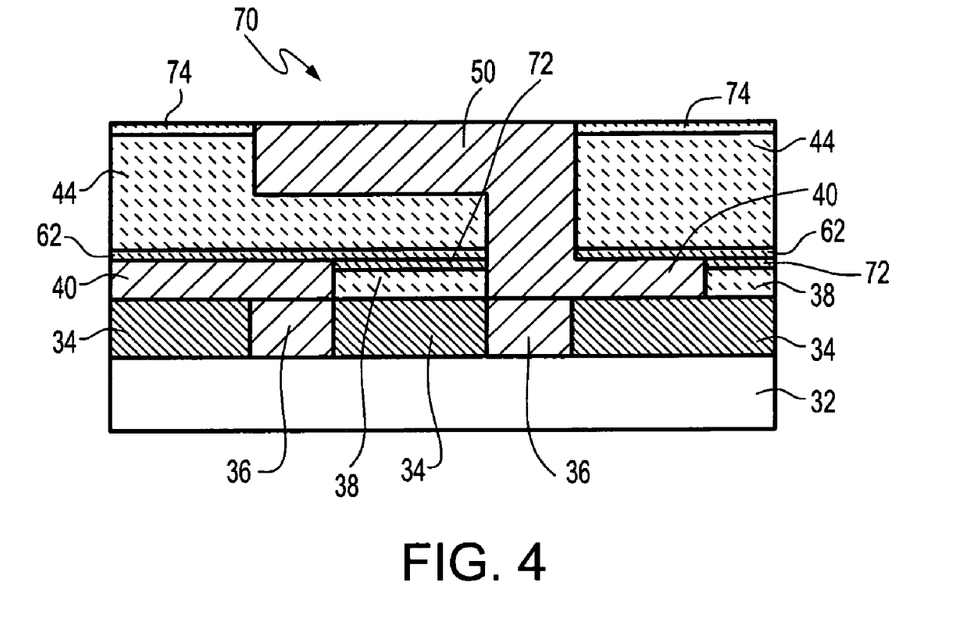
FIG. 4 is an enlarged, cross-sectional view of the electronic structure of FIG. 3 having an additional RIE hard mask/polish-stop dielectric cap layer and a dielectric cap diffusion barrier layer deposited on top of the polish-stop layer.

Another alternate embodiment of the present invention electronic device 70 is shown in FIG. 4. In the electronic device 70, two additional dielectric cap layers 72 and 74 which act as a RIE mask and CMP (chemical mechanical polishing) polish stop layer are used. The first dielectric cap layer 72 is deposited on top of the first ultra low k insulating material layer 38 and used as a RIE mask and CMP stop, so the first conductor layer 40 and layer 72 are approximately co-planar after CMP. The function of the second dielectric layer 74 is similar to layer 72, however layer 74 is utilized in planarizing the second conductor layer 50. The polish stop layer 74 can be deposited of a suitable dielectric material such as silicon oxide, silicon nitride, silicon oxynitride, refractory metal silicon nitride with the refractory metal being Ta, Zr, Hf or W, silicon carbide, silicon carbo-oxide (SiCO), and their hydrogenated compounds. A preferred polish stop layer composition is SiCH or SiCOH for layers 72 or 74. A second dielectric layer 74 can be added on top of the second SiCOH dielectric film 44 for the same purposes.

Figure 5:
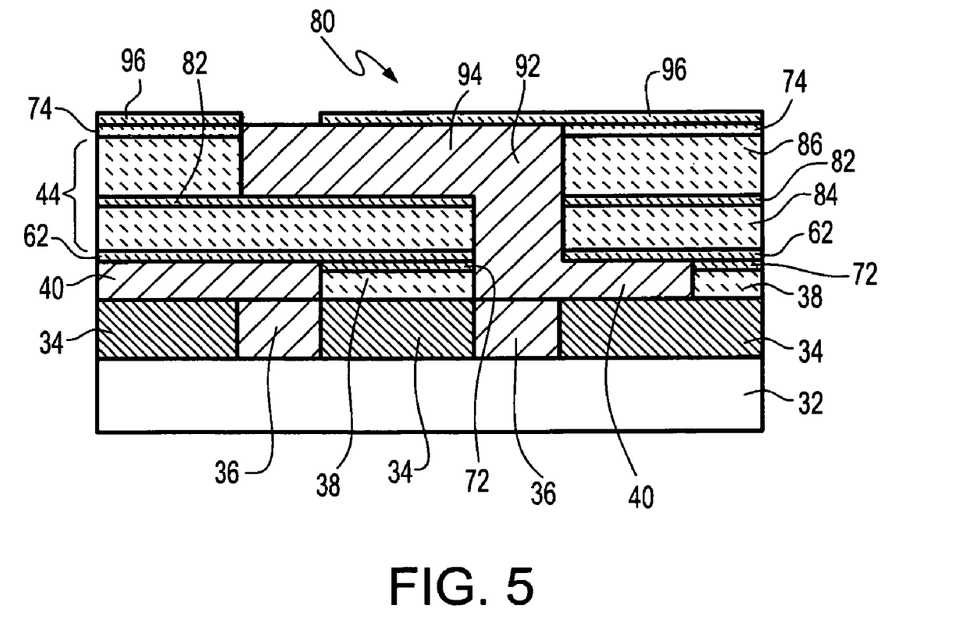
FIG. 5 is an enlarged, cross-sectional view of the electronic structure of FIG. 4 having additional RIE hard mask/polish-stop dielectric layers deposited on top of the SiCOH dielectric film of the present invention.

Still another alternate embodiment of the present invention electronic device 80 is shown in FIG. 5. In this alternate embodiment, an additional layer 82 of dielectric material is deposited and thus dividing the second insulating material layer 44 into two separate layers 84 and 86. The intralevel and interlevel dielectric layer 44 formed of the inventive low k material is therefore divided into an interlayer dielectric layer 84 and an intralevel dielectric layer 86 at the boundary between via 92 and interconnect 94. An additional diffusion barrier layer 96 is further deposited on top of the upper dielectric layer 74. The additional benefit provided by this alternate embodiment electronic structure 80 is that dielectric layer 82 acts as an RIE etch stop providing superior interconnect depth control. Thus, the composition of layer 82 is selected to provide etch selectivity with respect to layer 86.

Still other alternate embodiments may include an electronic structure which has layers of insulating material as intralevel or interlevel dielectrics in a wiring structure that includes a pre-processed semiconducting substrate which has a first region of metal embedded in a first layer of insulating material, a first region of conductor embedded in a second layer of the insulating material wherein the second layer of insulating material is in intimate contact with the first layer of insulating material, and the first region of conductor is in electrical communication with the first region of metal, a second region of conductor in electrical communication with the first region of conductor and is embedded in a third layer of insulating material, wherein the third layer of insulating material is in intimate contact with the second layer of insulating material, a first dielectric cap layer between the second layer of insulating material and the third layer of insulating material and a second dielectric cap layer on top of the third layer of insulating material, wherein the first and the second dielectric cap layers are formed of a material that includes atoms of Si, C, O and H, or preferably a SiCOH dielectric film of the present invention.

Still other alternate embodiments of the present invention include an electronic structure which has layers of insulating material as intralevel or interlevel dielectrics in a wiring structure that includes a pre-processed semiconducting substrate that has a first region of metal embedded in a first layer of insulating material, a first region of conductor embedded in a second layer of insulating material which is in intimate contact with the first layer of insulating material, the first region of conductor is in electrical communication with the first region of metal, a second region of conductor that is in electrical communication with the first region of conductor and is embedded in a third layer of insulating material, the third layer of insulating material is in intimate contact with the second layer of insulating material, and a diffusion barrier layer formed of the low k film of the present invention deposited on at least one of the second and third layers of insulating material.

Still other alternate embodiments include an electronic structure which has layers of insulating material as intralevel or interlevel dielectrics in a wiring structure that includes a pre-processed semiconducting substrate that has a first region of metal embedded in a first layer of insulating material, a first region of conductor embedded in a second layer of insulating material which is in intimate contact with the first layer of insulating material, the first region of conductor is in electrical communication with the first region of metal, a second region of conductor in electrical communication with the first region of conductor and is embedded in a third layer of insulating material, the third layer of insulating material is in intimate contact with the second layer of insulating material, a reactive ion etching (RIE) hard mask/polish stop layer on top of the second layer of insulating material, and a diffusion barrier layer on top of the RIE hard mask/polish stop layer, wherein the RIE hard mask/polish stop layer and the diffusion barrier layer are formed of the SiCOH dielectric film of the present invention.

Still other alternate embodiments include an electronic structure which has layers of insulating materials as intralevel or interlevel dielectrics in a wiring structure that includes a pre-processed semiconducting substrate that has a first region of metal embedded in a first layer of insulating material, a first region of conductor embedded in a second layer of insulating material which is in intimate contact with the first layer of insulating material, the first region of conductor is in electrical communication with the first region of metal, a second region of conductor in electrical communication with the first region of conductor and is embedded in a third layer of insulating material, the third layer of insulating material is in intimate contact with the second layer of insulating material, a first RIE hard mask, polish stop layer on top of the second layer of insulating material, a first diffusion barrier layer on top of the first RIE hard mask/polish stop layer, a second RIE hard mask/polish stop layer on top of the third layer of insulating material, and a second diffusion barrier layer on top of the second RIE hard mask/polish stop layer, wherein the RIE hard mask/polish stop layers and the diffusion barrier layers are formed of the SiCOH dielectric film of the present invention.

Still other alternate embodiments of the present invention includes an electronic structure that has layers of insulating material as intralevel or interlevel dielectrics in a wiring structure similar to that described immediately above but further includes a dielectric cap layer which is formed of the SiCOH dielectric material of the present invention situated between an interlevel dielectric layer and an intralevel dielectric layer.

The following example is provided to illustrate the inventive SiCOH dielectric material and to show the differences of the same from prior art SiCOH dielectrics.

EXAMPLE

In this example, a SiCOH dielectric material of the present invention was prepared and it was compared with prior art SiCOH dielectrics. The inventive SiCOH dielectric (Sample A) was prepared using the method described above. The first precursor was OMCTS and the oxidizing agent was $O_2$. The deposition conditions included: a OMCTS flow of 2800 mgm, an $O_2$ flow of 220 sccm, a He carrier flow of 1000 sccm, a substrate deposition temperature of 350° C., a pressure of 5 Torr, a spacing of 450 mils, a HF power of 400 W, and a LF power of 60 W.

Another sample, Sample B, was made using the above procedure except that after deposition it was subjected to UV treatment.

Prior art SiCOH dielectric, Sample C was prepared using OMCTS as the precursor and the following conditions were used: a OMCTS flow of 2500 mgm, an $O_2$ flow of 160 sccm, a He carrier flow of 1000 sccm, a substrate deposition temperature of 350° C., a pressure of 5 Torr, a spacing of 450 mils, a HF power of 500 W, and a LF power of 150 W.

Prior art SiCOH dielectric sample D was prepared as follows: OMCTS flow of 2500 mgm, an $O_2$ flow of 160 sccm, a He carrier flow of 1000 sccm, a substrate deposition temperature of 350° C., a pressure of 5 Torr, a spacing of 450 mils, a HF power of 500 W, and a LF power of 140 W.

Figure 6:
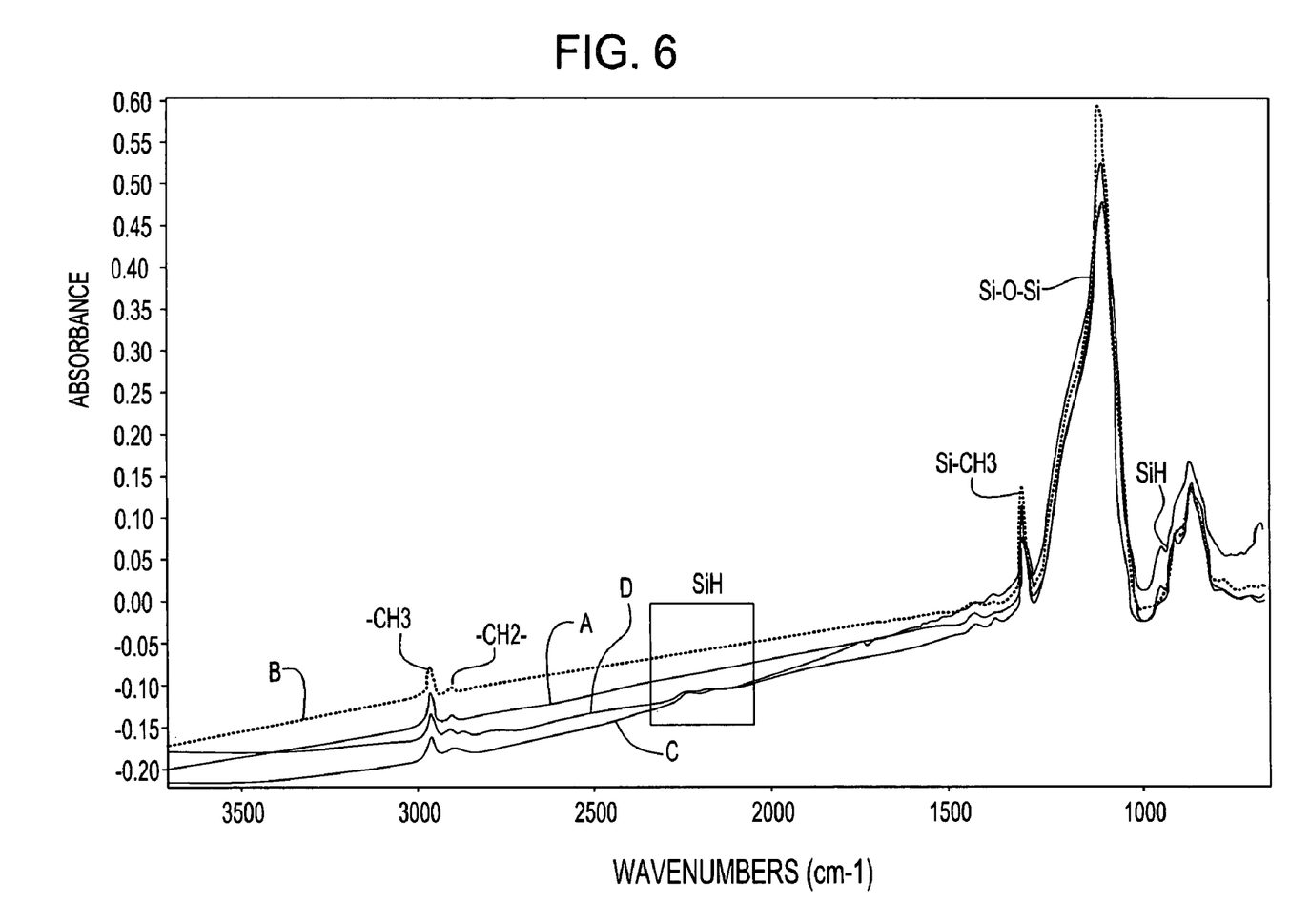
FIG. 6 is a FTIR spectra of different SiCOH dielectrics including the inventive as deposited SiCOH dielectric A, the inventive UV treated SiCOH dielectric B, prior art SiCOH dielectric C and prior art SiCOH dielectric D.
Figure 7:
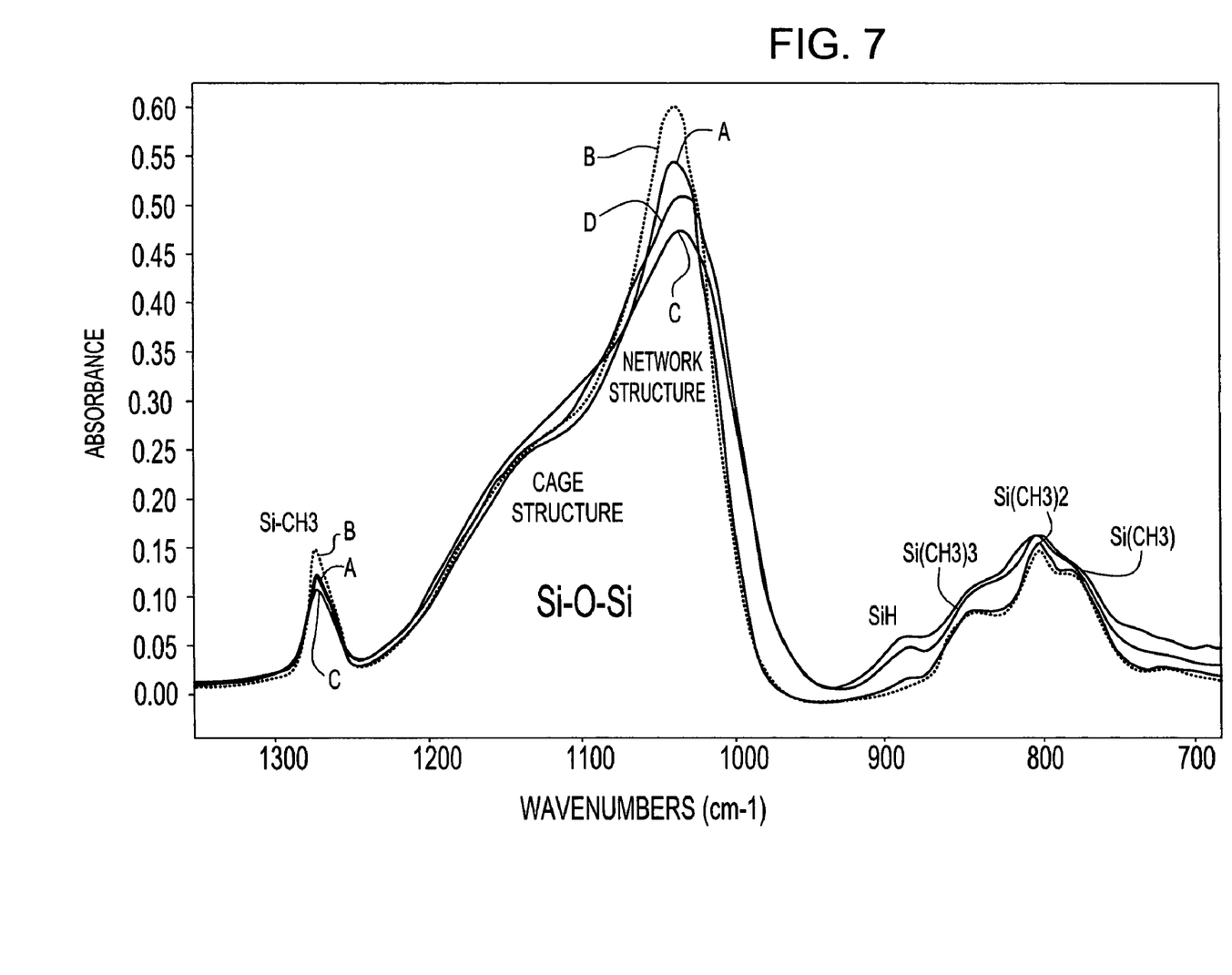
FIG. 7 is the FTIR spectra as shown in FIG. 6 in which the wavelength range between 1300 $cm^{-1}$ and 700 $cm^{-1}$ is emphasized.

The FTIR spectra for Samples A–D are shown in FIGS. 6 and 7 respectfully. The FTIR result showed that the OMCATS samples A and B have a higher degree of short range bonding interaction indicated by the sharper half peak width at Si—CH$_3$ bonding (around 1270 cm$^{-1}$ and approximately 800 cm$^{-1}$) and Si—O—Si network bonding (at approximately 1030 cm$^{-1}$). The sharper bonding peaks indicated a more short range bonding order in the Si-CH$_3$ and Si—O—Si network.

Figure 8:
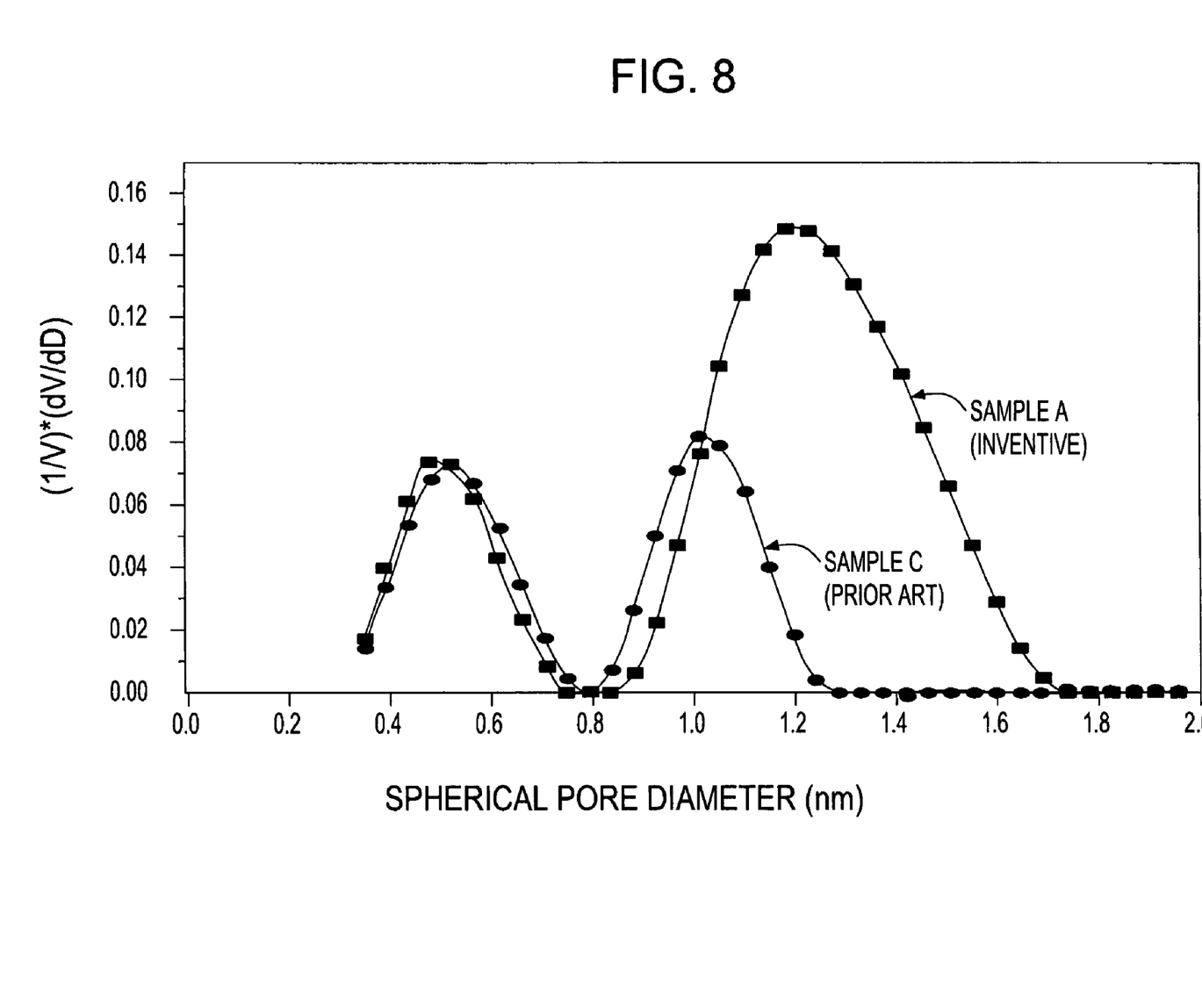
FIG. 8 is a graph illustrating the porosity of the inventive SiCOH dielectric A compared with a prior art SiCOH dielectric C.

In addition to FTIR data, the porosity of Sample A and prior art Sample C was measured using positronium annihilation lifetime spectroscopy (PALS). The results of the porosity measurements are shown in FIG. 8. Specifically, FIG. 8 shows that the inventive SiCOH dielectric material had a higher porosity (between 22–25%) as compared with the prior art SiCOH dielectric (porosity of about 10–12%).

Electrical measurement showed that the inventive films of 100–500 nm thickness had excellent breakdown voltage of greater than 8.5 MV/cm and low leakage of less than 5E-8 Amp/cm$^2$ at 2 MV/cm applied field.

While the present invention has been described in an illustrative manner, it should be understood that the terminology used is intended to be in a nature of words of description rather than of limitation. Furthermore, while the present invention has been described in terms of a preferred and several alternate embodiments, it is to be appreciated that those skilled in the art will readily apply these teachings to other possible variations of the invention.

What is claimed is:

1. A dielectric material comprising atoms of Si, C, O and H and having a tri-dimensional network structure in which the material has a FTIR spectrum comprising a peak area for CH$_3$+CH$_2$ stretching of less than about 1.40, a peak area for SiH stretching of less than about 0.20, a peak area for SiCH$_3$ bonding of greater than about 2.0, and a peak area for Si—O—Si bonding of greater than about 60.

2. The dielectric material of claim 1 wherein said material has a dielectric constant of less than about 3.0.

3. The dielectric material of claim 2 wherein said dielectric constant is in a range from about 2.2 to about 2.8.

4. The dielectric material of claim 1 wherein said peak area for CH$_3$+CH$_2$ stretching is located at about 2830 to about 3050 cm$^{-1}$, said peak area for SiH stretching is located at about 2170 to about 2240 cm$^{-1}$, said peak area for SiCH$_3$ bonding is located at about 1250 to about 1290 cm$^{-1}$ and about 750 to about 860 cm$^{-1}$, and said peak area for Si—O—Si bonding is located at about 960 to about 1220 cm$^{-1}$.

5. The dielectric material of claim 1 wherein said peak area for CH$_3$+CH$_2$ stretching is about 1.35, said peak area for SiH stretching is about 0.13, said peak area for SiCH$_3$ bonding is about 2.18 and said peak area for Si—O—Si bonding is about 62.9.

6. The dielectric material of claim 1 wherein said porosity is from about 22 to about 25%.

7. The dielectric material of claim 1 wherein said dielectric material has a modulus value ranging from about 6 to about 12 GPa, a hardness ranging from about 0.8 to about 1.6 GPa, a stress ranging from about 35 to about 70 MPa, a cohesive strength from about 2.5 to about 6 J/m$^2$, a crack velocity at 1.2 µm of from about 1E-12 to about 4E-10 m/sec, and a density, as measured by RBS, from about 4E22 to about 9E22 atom/cm$^3$.

8. The dielectric material of claim 1 wherein said material has a breakdown voltage of greater than about 7 MV/cm, and a leakage density of about 1E-9 Amp/cm$^2$ at 2 MV/cm applied voltage or greater.

9. The dielectric material of claim 1 wherein said material is treated to provide a material having a modulus of about 9 to about 11 GPa.

10. An interconnect structure located on a substrate comprising at least one dielectric material comprising atoms of Si, C, O and H and having a tri-dimensional network structure in which the material has a FTIR spectrum comprising a peak area for CH$_3$+CH$_2$ stretching of less than about 1.40, a peak area for SiH stretching of less than about 0.20, a peak area for SiCH$_3$ bonding of greater than about 2.0, and a peak area for Si—O—Si bonding of greater than about 60%.

11. The interconnect structure of claim 10 wherein said material has a dielectric constant of less than about 3.0.

12. The interconnect structure of claim 11 wherein said dielectric constant is in a range from about 2.2 to about 2.8.

13. The interconnect structure of claim 10 wherein said peak area for CH$_3$+CH$_2$ stretching is located at about 2830 to about 3050 cm$^{-1}$, said peak area for SiH stretching is located at about 2170 to about 2240 cm$^{-1}$, said peak area for SiCH$_3$ bonding is located at about 1250 to about 1290 cm$^{-1}$ and about 750 to about 860 cm$^{-1}$, and said peak area for Si—O—Si bonding is located at about 960 to about 1220 cm$^{-1}$.

14. The interconnect structure of claim 10 wherein said peak area for CH$_3$+CH$_2$ stretching is about 1.35, said peak area for SiH stretching is about 0.13, said peak area for SiCH$_3$ bonding is about 2.18 and said peak area for Si—O—Si bonding is about 62.9.

15. The interconnect structure of claim 10 wherein said porosity is from about 22 to about 25%.

16. The interconnect structure of claim 10 wherein said dielectric material has a modulus value ranging from about 6 to about 12 GPa, a hardness ranging from about 0.8 to about 1.6 GPa, a stress ranging from about 35 to about 70 MPa, a cohesive strength from about 2.5 to about 6 J/m$^2$, a crack velocity at 1.2 µm of from about 1E-12 to about 4E-10 m/sec, and a density, as measured by RBS, from about 4E22 to about 9E22 atom/cm$^3$.

17. The interconnect structure of claim 10 wherein said material has a breakdown voltage of greater than about 7 MV/cm, and a leakage density of about 1E-9 Amp/cm$^2$ at 2 MV/cm applied voltage or greater.

18. The interconnect structure of claim 10 wherein said dielectric material has at least one conductive region embedded therein.

19. The interconnect structure of claim 10 wherein said dielectric material is one of an interlevel dielectric, an intralevel dielectric, a capping layer, or a hard mask.

20. A method for forming a SiCOH dielectric on a substrate comprising:

placing a substrate in a reactor;

introducing a first precursor comprising atoms of Si, C, O and H, an oxidizing agent and an inert carrier into said reactor, wherein an oxidizing agent/first precursor molar ratio of about 1:2 or greater is employed; and depositing a SiCOH dielectric film comprising atoms of Si, C, O and H and having a tri-dimensional network structure in which the material has a FTIR spectrum comprising a peak area for CH$_3$+CH$_2$ stretching of less than about 1.40, a peak area for SiH stretching of less than about 0.20, a peak area for SiCH$_3$ bonding of greater than about 2.0, and a peak area for Si—O—Si bonding of greater than about 60 onto said substrate.

21. The method of claim 20 wherein said first precursor comprises organic mol with a ring structure that includes at least atoms of Si, C, O and H.

22. The method of claim 21 wherein said first precursor comprises one of 1,3,5,7-tetramethylcyclotetrasiloxane ("TMCTS" or "$C_4H_{16}O_4Si_4$"), octamethylcyclotetrasiloxane (OMCTS), diethoxymethylsilane (DEMS), dimethyldimethoxysilane (DMDMOS), diethylmethoxysilane (DEDMOS), or other cyclic and non-cyclic silanes or siloxanes.

23. The method of claim 20 wherein said oxidizing agent comprises at least one of $O_2$, $CO_2$ or $N_2O$.

24. The method of claim 20 wherein said inert carrier comprises Ar, He, Ne, Xe or mixtures thereof.

25. The method of claim 20 wherein said first precursor is OMCTS, said oxidizing agent is $O_2$ and said inert carrier is He.

26. The method of claim 20 wherein said depositing is performed using a low high frequency (HF)/low frequency (LF) power on the order of about 150 Watts or less.

27. The method of claim 20 wherein said depositing includes setting a substrate temperature at between about 250° C. and about 450° C.; setting a high frequency RF power density at between about 0.20 W/cm$^2$ and about 0.85 W/cm$^2$; setting the first precursor flow rate at between about 1800 mg/min and about 3600 mg/min, setting the oxidizing agent flow rate at between about 120 to about 320 sccm, setting the inert carrier gases flow rate at between about 500 sccm to about 2000 sccm; setting a reactor pressure at a pressure between about 4 Torr and about 8 Torr; setting a high frequency RF power between about 150 W and about 800 W; and setting a low frequency power between about 0 W and about 200 W.

28. The method of claim 20 further comprising subjecting said deposited dielectric material is a post treatment step.

29. The method of claim 28 wherein said post treatment step comprises utilizing an energy source selected from thermal, electron beam, plasma, microwave and UV optical radiation.

* * * * *

UNITED STATES PATENT AND TRADEMARK OFFICE
CERTIFICATE OF CORRECTION

PATENT NO. : 7,202,564 B2 Page 1 of 1
APPLICATION NO. : 10/906370
DATED : April 10, 2007
INVENTOR(S) : Nguyen et al.

It is certified that error appears in the above-identified patent and that said Letters Patent is hereby corrected as shown below:

Title page, item (73) Assignee should read as follows:

International Business Machines, Corporation, Armonk, New York (US);

Sony Corporation, Tokyo, Japan (JP);

Sony Electronics Inc., Park Ridge, New Jersey (US)

Signed and Sealed this

Eighth Day of April, 2008

JON W. DUDAS
*Director of the United States Patent and Trademark Office*